(12) United States Patent
Mann et al.

(10) Patent No.: US 8,716,597 B2
(45) Date of Patent: May 6, 2014

(54) IMPLEMENTING ENHANCED DIMENSIONAL STABILITY WITH GRAPHITE NANOTUBE HYBRID SOCKET

(75) Inventors: Phillip V. Mann, Rochester, MN (US); Kevin M. O'Connell, Rochester, MN (US); Mark D. Plucinski, Rochester, MN (US); Sandra J. Shirk/Heath, Rochester, MN (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 13/346,986

(22) Filed: Jan. 10, 2012

(65) Prior Publication Data

US 2013/0178092 A1 Jul. 11, 2013

(51) Int. Cl.
*H02G 3/08* (2006.01)
*H01R 13/14* (2006.01)
*B82Y 40/00* (2011.01)

(52) U.S. Cl.
USPC ............ 174/50; 174/520; 439/485; 977/810; 977/932

(58) Field of Classification Search
USPC .................. 174/50, 53, 520, 17 R, 559, 388; 220/3.2, 3.3, 4.02; 361/600, 601, 361/679.01, 679.02, 704–710, 714, 816, 361/818, 724, 728, 730, 752; 165/80.3, 165/104.33, 185, 80.1; 312/223.2, 223.1, 312/236; 439/76.1, 76.2, 535, 658, 485; 264/105, 104; 977/700, 773, 810, 932
See application file for complete search history.

(56) References Cited

U.S. PATENT DOCUMENTS

| | | | |
|---|---|---|---|
| 5,906,882 A * | 5/1999 | Valente et al. | 174/388 |
| 6,005,188 A * | 12/1999 | Teichler et al. | 174/50 |
| 6,147,301 A * | 11/2000 | Bhatia | 174/388 |
| 6,365,076 B1 * | 4/2002 | Bhatia | 264/105 |
| 6,444,102 B1 | 9/2002 | Tucci et al. | |
| 6,626,684 B1 | 9/2003 | Stickler et al. | |
| 6,994,584 B1 | 2/2006 | Santana, Jr. et al. | |
| 7,439,731 B2 | 10/2008 | Crafts et al. | |
| 7,652,492 B2 | 1/2010 | Wang et al. | |
| 7,710,106 B2 | 5/2010 | Crafts et al. | |
| 8,038,479 B2 * | 10/2011 | Searfass | 439/658 |
| 8,570,747 B2 * | 10/2013 | Cheng et al. | 174/520 |

* cited by examiner

*Primary Examiner* — Angel R Estrada
(74) *Attorney, Agent, or Firm* — Joan Pennington

(57) ABSTRACT

A method and structure for implementing enhanced dimensional stability with a graphite nanotube hybrid socket. A socket housing wall includes a plurality of aligned graphite nanofibers. The plurality of aligned graphite nanofibers distributing heat and providing enhanced dimensional stability. For example, the plurality of aligned graphite nanofibers more evenly distributes heat when the socket is undergoing solder reflow processes, thereby reducing strain.

18 Claims, 3 Drawing Sheets

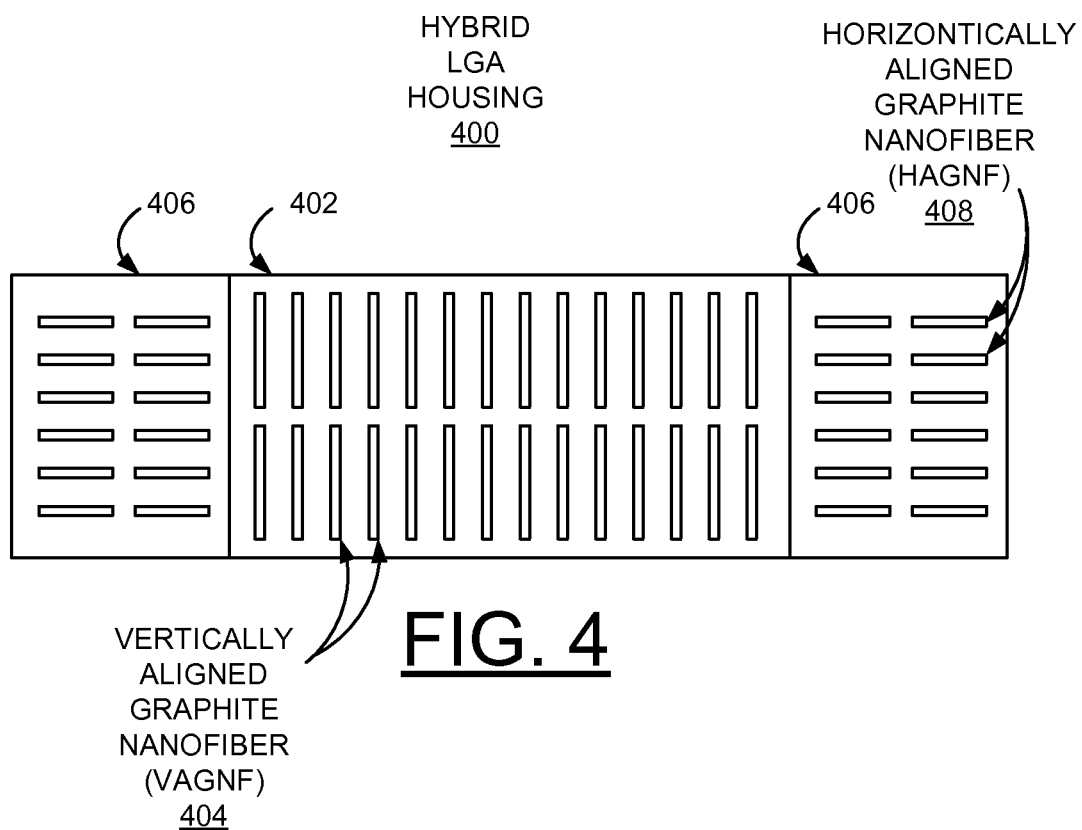

IMPLEMENTING ENHANCED DIMENSIONAL STABILITY WITH GRAPHITE NANOTUBE HYBRID SOCKET

FIELD OF THE INVENTION

The present invention relates generally to the data processing field, and more particularly, to a method, and structures for implementing enhanced dimensional stability with a graphite nanotube hybrid socket.

DESCRIPTION OF THE RELATED ART

While nanotube may describe a tubular structure and nanofiber may describe a non-tubular structure, as used in the following specification and claims, the terms "graphite nanotube" and "graphite nanofiber" are used interchangeably herein and should be broadly understood to include both tubular and non-tubular graphite structures.

Land grid array (LGA) sockets and Hybrid LGA sockets (HLGA) are used in computer systems as a means of connecting the processor packages to a printed circuit card. The LGA sockets currently used in server and PC applications are attached to the printed circuit cards with individual free floating springs. The free floating springs are typically contained in a matrix material. A uniaxial load is generally required to mate the processor laminate to the printed circuit board. This type of attachment is expensive and requires tight control of registration.

An alternative to the LGA socket is the Hybrid LGA sockets (HLGA). In HLGA type of attachment, the top end of the spring proximate to a processor side is free to float while the other end of the spring is physically soldered to the printed circuit board. This reduces the cost of the socket and mitigates registration issues.

One major draw back of the HLGA socket design is the dimensional stability of the socket over larger package footprint, for example, greater than 50 mm. The HLGA socket design also results in higher solder strain due to larger specific heat and conductivity for the material currently used. As processor performance trends continue to drive higher speed signaling with an increased number of cores and footprint, the electrical performance for HLGA socket design will not be acceptable and a need exists to use HLGA sockets that use innovative material design to mitigate these issues.

A need exists for an effective mechanism for implementing enhanced dimensional stability with a socket design. It is desirable to provide a socket that has a generally simple configuration and that is generally inexpensive to produce.

SUMMARY OF THE INVENTION

Principal aspects of the present invention are to provide a method, and structures for implementing enhanced dimensional stability with a graphite nanotube hybrid socket. Other important aspects of the present invention are to provide such method and structures substantially without negative effects and to overcome many of the disadvantages of prior art arrangements.

In brief, a method and structure for implementing enhanced dimensional stability with a graphite nanotube hybrid socket. A socket housing wall includes a plurality of aligned graphite nanofibers. The plurality of aligned graphite nanofibers distributing heat and providing enhanced dimensional stability. For example, the plurality of aligned graphite nanofibers more evenly distributes heat when the socket is undergoing solder reflow processes, thereby reducing strain.

In accordance with features of the invention, the plurality of aligned graphite nanofibers includes a plurality of vertically aligned graphite nanofibers (VAGNF). The plurality of aligned graphite nanofibers optionally also includes a plurality of horizontally aligned graphite nanofibers (HAGNF).

In accordance with features of the invention, socket housing wall including the aligned graphite nanofibers is formed of a durable, insulating material, such as a plastic or other polymer material.

In accordance with features of the invention, forming the socket housing wall including the aligned graphite nanofibers includes an extrusion process that includes, for example, flowing a set mixture of a resin and graphite nanofibers into a die and extruding the socket housing wall for providing the aligned graphite nanofibers in the socket housing wall.

In accordance with features of the invention, the socket includes a hybrid land grid array (LGA) socket housing.

BRIEF DESCRIPTION OF THE DRAWINGS

The present invention together with the above and other objects and advantages may best be understood from the following detailed description of the preferred embodiments of the invention illustrated in the drawings, wherein:

FIG. 4 schematically illustrate not to scale of another example structure for implementing enhanced dimensional stability with a graphite nanotube hybrid socket in accordance with a preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structure are provided for implementing enhanced dimensional stability with a graphite nanotube hybrid socket.

Figure 1:
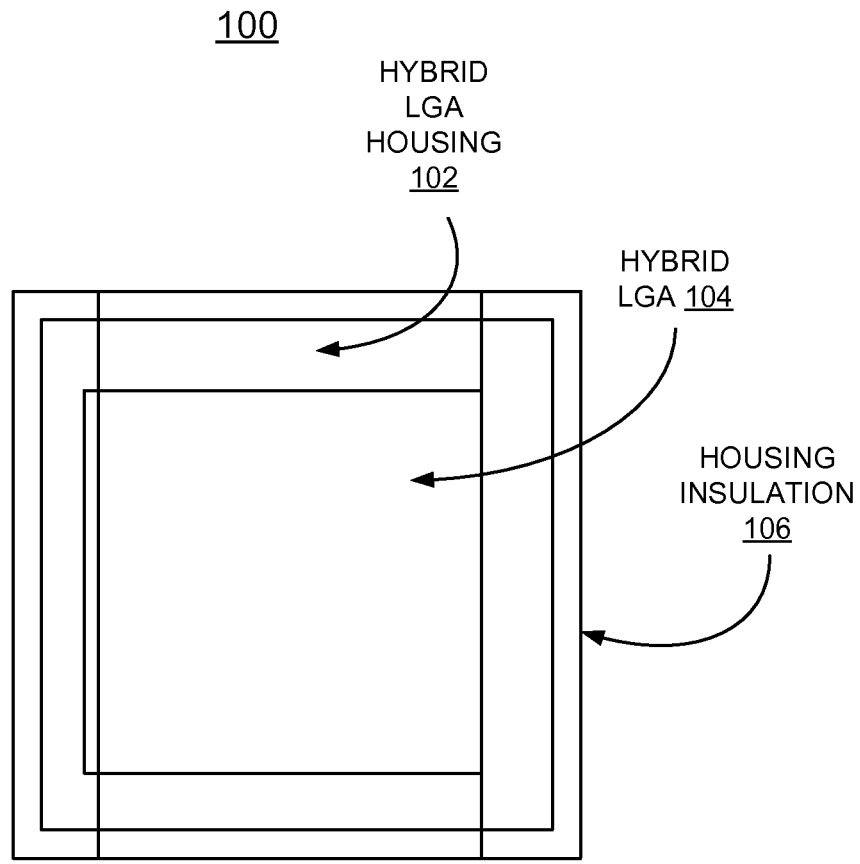
FIGS. 1, 2, and 3 schematically illustrate not to scale of an example structure for implementing enhanced dimensional stability with a graphite nanotube hybrid socket in accordance with a preferred embodiment.
Figure 2:
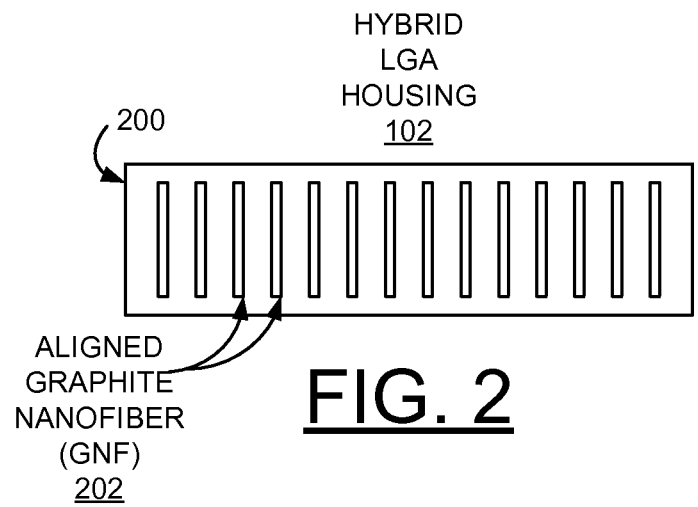
Figure 3:
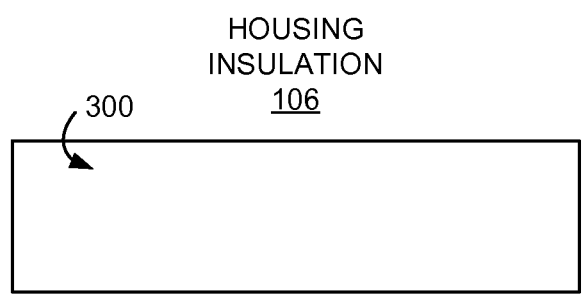

Having reference now to the drawings, in FIGS. 1, 2, and 3 there is shown not to scale an example socket structure for implementing enhanced dimensional stability with a graphite nanotube hybrid socket generally designated by the reference character 100 in accordance with a preferred embodiment.

Referring to FIG. 1, the socket structure 100 includes a hybrid land grid array (LGA) housing generally designated by the reference character 102 surrounding a hybrid LGA 104, and a housing insulation 106.

Referring to FIG. 2, a cross-section view of the hybrid land grid array (LGA) housing 102 illustrates a socket housing wall 200 in accordance with a preferred embodiment. The socket housing wall 200 includes a plurality of plurality of aligned graphite nanofibers generally designated by the reference character 202. The plurality of aligned graphite nanofibers 202 more evenly distribute heat when the socket is undergoing solder reflow processes, thereby reducing strain for providing enhanced dimensional stability.

In accordance with features of the invention, the plurality of aligned graphite nanofibers 202 includes a plurality of vertically aligned graphite nanofibers (VAGNF) 202, as shown in FIG. 2. The socket housing wall 200 including the aligned graphite nanofibers is formed by an extrusion process includes, for example, flowing a set mixture of a resin, such as a polymer material and graphite nanofibers into a die and extruding the socket housing wall for providing the aligned graphite nanofibers in the socket housing wall 202. For example, the set resin and GNF mixture maintains the GNF % in the mixture at about 30%.

FIG. 3 illustrates the housing insulation 106 including an insulating member 300, which is formed of a durable, insulating material, such as a plastic, ceramic, or the like.

In accordance with features of the invention, LGA housing 102 including socket housing wall 200 can be formed of a durable, insulating material, such as a plastic or other polymer material, ceramic, or the like with the plurality of aligned graphite nanofibers 202. It should be understood that the socket housing wall 200 may include multiple layers of materials, such as one or more insulating layers including the plurality of aligned graphite nanofibers 202, together with electrically conductive layers, structural support layers, stiffening layers, heat dissipation layers, and the like.

In accordance with features of the invention, the plurality of aligned graphite nanofibers includes a plurality of vertically aligned graphite nanofibers (VAGNF) and optionally also includes a plurality of horizontally aligned graphite nanofibers (HAGNF) as shown in FIG. 4.

Referring now to FIG. 4, there is shown an LGA housing generally designated by the reference character 400 in accordance with a preferred embodiment. LGA housing 400 includes a socket housing wall segment 402 including a plurality of vertically aligned graphite nanofibers (VAGNF) 404, and one or more socket housing wall segments 406 with two shown. Each socket housing wall segments 406 includes a plurality of horizontally aligned graphite nanofibers (HAGNF) 408.

In accordance with features of the invention, the aligned graphite nanofibers 202 of hybrid socket 100, and the vertically aligned graphite nanofibers (VAGNF) 404 and horizontally aligned graphite nanofibers (HAGNF) 408 of the LGA housing 400 provide a decreased temperature gradient, more evenly distribute heat when the socket is undergoing solder reflow processes, thereby reducing strain imparted to the solder and providing enhanced dimensional stability.

While the present invention has been described with reference to the details of the embodiments of the invention shown in the drawing, these details are not intended to limit the scope of the invention as claimed in the appended claims.

What is claimed is:

1. A structure for implementing enhanced dimensional stability for a hybrid socket comprising:
   a socket housing wall;
   a plurality of aligned graphite nanofibers contained in said socket housing wall;
   and said plurality of aligned graphite nanofibers distributing heat and providing enhanced dimensional stability.

2. The structure as recited in claim 1 wherein said socket housing wall containing said plurality of aligned graphite nanofibers is formed by an extrusion process using a die and a set mixture of a resin and graphite nanofibers.

3. The structure as recited in claim 1 wherein said plurality of aligned graphite nanofibers includes a plurality of vertically aligned graphite nanofibers (VAGNF).

4. The structure as recited in claim 1 wherein said plurality of aligned graphite nanofibers includes a plurality of horizontally aligned graphite nanofibers (HAGNF).

5. The structure as recited in claim 1 wherein said plurality of aligned graphite nanofibers includes a plurality of vertically aligned graphite nanofibers (VAGNF) and a plurality of horizontally aligned graphite nanofibers (HAGNF).

6. The structure as recited in claim 1 wherein said socket housing wall including the aligned graphite nanofibers is formed of a durable, insulating material.

7. The structure as recited in claim 1 wherein said socket housing wall including the aligned graphite nanofibers is formed of a plastic material.

8. The structure as recited in claim 1 wherein said socket housing wall including the aligned graphite nanofibers is formed of a polymer material.

9. The structure as recited in claim 1 wherein said socket includes a hybrid land grid array (LGA) socket housing.

10. A method for implementing enhanced dimensional stability for a hybrid socket comprising:
    providing a socket housing wall including a plurality of aligned graphite nanofibers contained in said socket housing wall; and
    distributing heat and providing enhanced dimensional stability with said plurality of aligned graphite nanofibers.

11. The method as recited in claim 10 wherein providing a socket housing wall including a plurality of aligned graphite nanofibers contained in said socket housing wall includes providing a plurality of vertically aligned graphite nanofibers (VAGNF) contained in said socket housing wall.

12. The method as recited in claim 10 wherein providing a socket housing wall including a plurality of aligned graphite nanofibers contained in said socket housing wall includes providing a plurality of horizontally aligned graphite nanofibers (HAGNF) contained in said socket housing wall.

13. The method as recited in claim 10 wherein providing a socket housing wall including a plurality of aligned graphite nanofibers contained in said socket housing wall includes providing a plurality of vertically aligned graphite nanofibers (VAGNF) contained in said socket housing wall and providing a plurality of horizontally aligned graphite nanofibers (HAGNF) contained in said socket housing wall.

14. The method as recited in claim 10 includes forming said socket housing wall including the aligned graphite nanofibers of a durable, insulating material.

15. The method as recited in claim 10 includes forming said socket housing wall including the aligned graphite nanofibers of a plastic material.

16. The method as recited in claim 10 includes forming said socket housing wall including the aligned graphite nanofibers of a polymer material.

17. The method as recited in claim 10 includes forming said socket housing wall using an extrusion process with a die and a mixture of a resin material and graphite nanofibers to provide said socket housing wall with the aligned graphite nanofibers.

18. The method as recited in claim 10 wherein said socket includes a hybrid land grid array (LGA) socket housing.

* * * * *